(12) United States Patent
Lachmi et al.

(10) Patent No.: US 12,308,204 B2
(45) Date of Patent: May 20, 2025

(54) OPTICAL AUTO-FOCUS UNIT AND A METHOD FOR AUTO-FOCUS

(71) Applicant: APPLIED MATERIALS ISRAEL LTD., Rehovot (IL)

(72) Inventors: Sissi Lachmi, Rehovot (IL); Hagay Famini, Moshav Ptachia (IL)

(73) Assignee: Applied Materials Israel Ltd., Rehovot (IL)

( * ) Notice: Subject to any disclaimer, the term of this patent is extended or adjusted under 35 U.S.C. 154(b) by 414 days.

(21) Appl. No.: 17/893,836

(22) Filed: Aug. 23, 2022

(65) Prior Publication Data

US 2024/0071715 A1   Feb. 29, 2024

(51) Int. Cl.
   *H01J 37/21* (2006.01)
   *H01J 37/147* (2006.01)
   *H01J 37/28* (2006.01)

(52) U.S. Cl.
   CPC .......... *H01J 37/21* (2013.01); *H01J 37/1478* (2013.01); *H01J 37/28* (2013.01); *H01J 2237/216* (2013.01)

(58) Field of Classification Search
   CPC .. H01J 37/00; H01J 37/02; H01J 37/21; H01J 37/1478; H01J 37/26; H01J 37/28; H01J 37/228; H01J 2237/216; H01J 2237/2482; G02B 21/006; G02B 21/0016; G02B 21/0032; G02B 21/0056; G02B 21/06; G02B 21/241; G02B 21/365
   USPC ................................. 250/306, 307, 310, 311
   See application file for complete search history.

(56) References Cited

U.S. PATENT DOCUMENTS

| | | | |
|---|---|---|---|
| 2003/0127593 A1* | 7/2003 | Shinada | H01J 37/29 250/310 |
| 2007/0109557 A1* | 5/2007 | Saito | H01J 37/20 356/602 |
| 2011/0260055 A1* | 10/2011 | Wang | G01N 23/20058 356/612 |
| 2019/0323835 A1* | 10/2019 | Sekiguchi | H01J 37/28 |
| 2020/0176217 A1* | 6/2020 | Takahashi | G01B 9/02027 |

* cited by examiner

*Primary Examiner* — Jason L McCormack
(74) *Attorney, Agent, or Firm* — Kilpatrick Townsend & Stockton LLP

(57) ABSTRACT

A charged particle evaluation system that may include a column that includes an opening; an illumination unit that is configured to scan an area of a sample with an electron beam that passes through the opening; and an optical auto-focus unit that is configured to (i) illuminate the sample with an optical beam that is proximate to the electron beam, during the scan of the area with the electron beam; (ii) receive a reflected optical beam from the sample, (iii) determine a focus status of the electron beam, and (iv) participate in a compensating of an electron beam misfocus.

16 Claims, 3 Drawing Sheets

OPTICAL AUTO-FOCUS UNIT AND A METHOD FOR AUTO-FOCUS

BACKGROUND OF THE INVENTION

A scanning electron microscope (SEM) scans a surface of a sample with a primary electron beam. During the scanning, the surface has to be located at the focal point of the SEM.

Various samples such as semiconductor wafers have a surface that is not perfectly flat and horizontal—which requires to a fast and accurate auto-focus solution.

BRIEF SUMMARY OF THE INVENTION

There may be provided a charged particle evaluation system that may include a column that includes an opening; an illumination unit that is configured to scan an area of a sample with an electron beam that passes through the opening; and an optical auto-focus unit that is configured to (i) illuminate the sample with an optical beam that is proximate to the electron beam, during the scan of the area with the electron beam; (ii) receive a reflected optical beam from the sample, (iii) determine a focus status of the electron beam, and (iv) participate in a compensating of an electron beam misfocus.

There may be provided a method for auto-focus, the method may include scanning, by an illumination unit, an area of a sample with an electron beam that passes through an opening of a column; illuminating, by an optical auto-focus unit, 'the sample with an optical beam that is proximate to the electron beam, during the scan of the area with the electron beam; receiving, by the optical auto-focus unit, a reflected optical beam from the sample; determining, by the optical auto-focus unit, a focus status of the electron beam; and participating, by the optical auto-focus unit, in a compensating of an electron beam misfocus.

There may be provided a non-transitory computer readable medium method that stores instructions that once executed by a charged particle evaluation system, cause the charged particle evaluation system to: scanning, by an illumination unit of the charged particle evaluation system, an area of a sample with an electron beam that passes through an opening of a column; illuminating, by an optical auto-focus unit of the charged particle evaluation system, 'the sample with an optical beam that is proximate to the electron beam, during the scan of the area with the electron beam; receiving, by the optical auto-focus unit, a reflected optical beam from the sample; determining, by the optical auto-focus unit, a focus status of the electron beam; and participating, by the optical auto-focus unit, in a compensating of an electron beam misfocus.

BRIEF DESCRIPTION OF THE DRAWINGS

The subject matter regarded as the invention is particularly pointed out and distinctly claimed in the concluding portion of the specification. The invention, however, both as to organization and method of operation, together with specimen s, features, and advantages thereof, may best be understood by reference to the following detailed description when read with the accompanying drawings in which:

Figure 1:
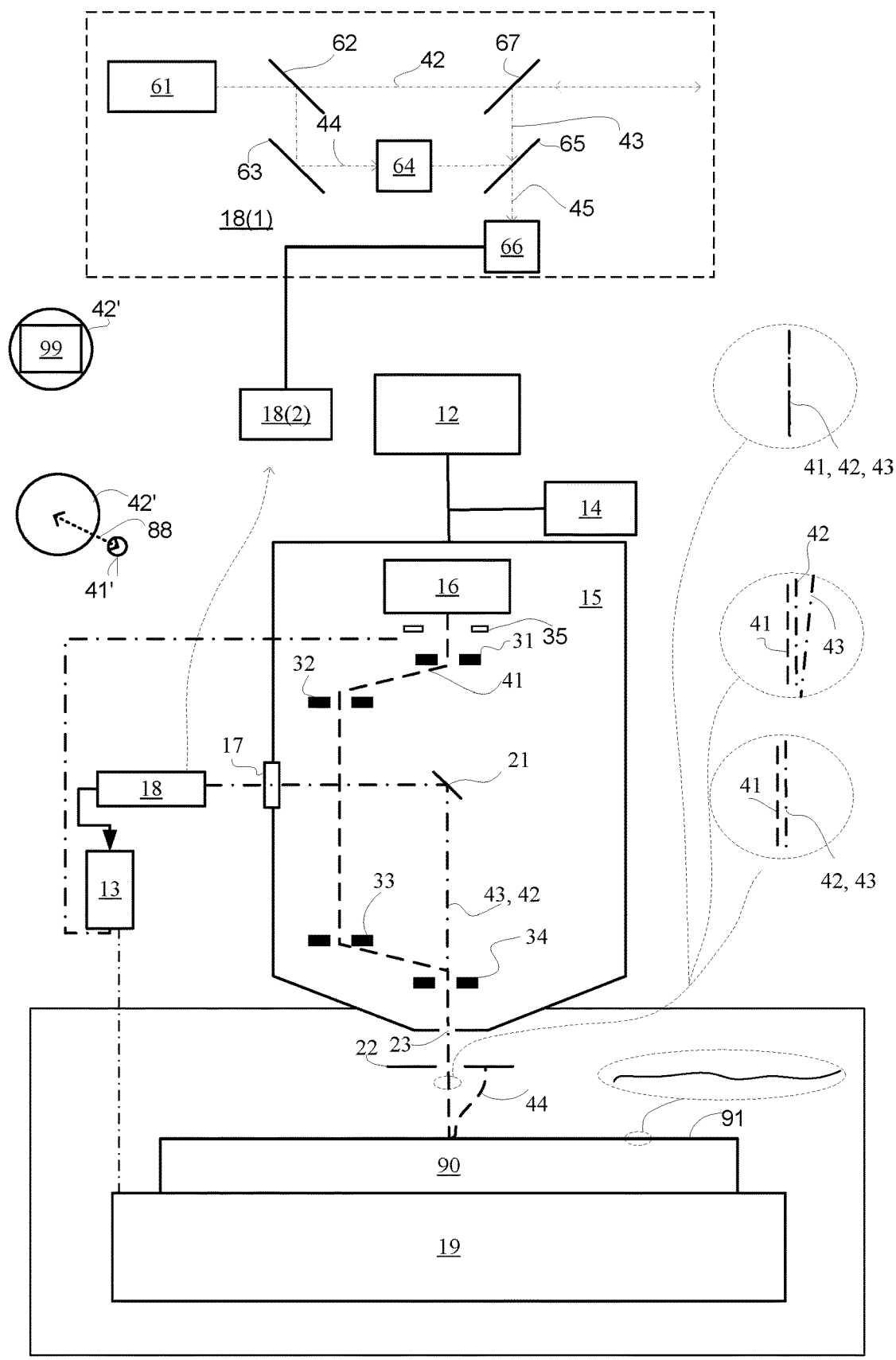
FIG. 1 illustrates an example of a system and a sample.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method and should be applied mutatis mutandis to a computer program product that stores instructions that once executed result in the execution of the method.

Any reference in the specification to a system should be applied mutatis mutandis to a method that may be executed by the system should be applied mutatis mutandis to a computer program product that stores instructions that can be executed by the system.

Any reference in the specification to a computer program product should be applied mutatis mutandis to a method that may be executed when executing instructions stored in the computer program product and should be applied mutandis to a system that is configured to executing instructions stored in the computer program product.

There may be provided a charged particle evaluation system that performs auto-focus based on measurements related to an optical beam that is proximate, on an object, to an electron beam thereby increasing the accuracy of the auto-focus. Furthermore, performing auto-focus based on an optical beam is much faster than image-based auto-focus.

FIG. 1 illustrates a charged particle evaluation system and a sample.

The charged particle evaluation system may use one or more charged particle beams (one or more electron beams and/or one more ion beams) to evaluate the sample. Examples of a charged particle evaluation beam may include a scanning electron microscope (SEM), a transmissive electron microscope (TEM), an electron beam imager, an ion beam imager, and the like.

For simplicity of explanation we will refer to a SEM 10 that uses a single electron beam such as electron beam 41.

The sample 90 may be a semiconductor wafer or may differ from a semiconductor wafer. The sample may include structural elements that have nanometric scale features such as but not limited to transistors, memory cells, and the like. Nanometric scale features may, for example, have one or more dimensions (length, depth, width, critical dimension, distance between adjacent structural features) that range between 0.1 to 500 nanometers.

The sample 90 includes a surface 91 that is illuminated by electron beam 41. The surface 91 may be curved or otherwise not perfectly flat and horizontal.

SEM 10 includes column 15, processing circuit 12, memory unit 14, controller 13, an illumination unit, a collection unit, one or more sensors, and the like.

The processing circuit may be configured to perform image processing, sample evaluation tasks, and the like—for example determine a critical dimension of a structural element, perform any other measurement, review defects, detect suspected defects, and the like.

Memory unit 14 may store measurement results, evaluation results, instructions to be executed by processing circuit 12, and the like.

Controller 13 may control any aspect of operation of SEM 10.

Column 15 includes an opening 23 and a window 17.

The illumination unit may include electron beam source 16, first deflector 31, second deflector 32, third deflector 33, fourth deflector 34 and electron optics lens 35—for example a focusing lens. The illumination unit is configured to scan an area of sample 90 with electron beam 41, whereas electron beam passes through opening 23. The electron optics lens 35 may be configured to determine the focal point of the electron beam.

While FIG. 1 illustrates four deflectors and a double-deflected electron beam, there may be less than four deflectors or more than four deflectors, and the electron beam may be deflected, within the column, once or more than twice.

SEM 10 further includes an optical auto-focus 18 unit that is configured to (i) illuminate the sample with an optical beam 42 that is proximate (for example at a distance that does not exceed 5, 4, 3, 2, 1 millimeter, or even less than one millimeter, for example, between 0.8 and 1.2 millimeters) to the electron beam 41 during the scan of the area with the electron beam; (ii) receive a reflected optical beam 43 from the sample, (iii) determine a focus status of the electron beam 41, and (iv) participate in a compensating of an electron beam misfocus.

The optical beam 42 may pass through the opening of the columns. Alternatively, the optical beam 42 may propagate outside the column.

The focus status may be focused or non-focused. When non-focused the state may indicate the extent of the misfocus to be compensated for.

The distance, on the sample, may include the distance 88 between a center of a spot 41' formed on surface 91 by the electron beam 41 and a center of a spot 42' formed on surface 91 by the optical beam 42. FIG. 1 also illustrates an example in which the spot 42' cover the entire area 99 scanned by the electron beam.

FIG. 1 illustrates three examples of spatial relationships between electron beam 41, optical beam 42 and reflected optical beam 43.

In the upper example the electron beam 41, optical beam 42 and reflected optical beam 43 fully overlap.

In the middle example the electron beam 41, optical beam 42 and reflected optical beam 43 are slightly spaced apart from each other, the electron beam 41 and the optical beam 42 are parallel to each other and the reflected optical beam 43 is tilted in relation to the electron beam 41 and the optical beam 42.

In the bottom example the electron beam 41 is spaced apart from and parallel to the fully overlapping optical beam 42 and reflected optical beam 43.

FIG. 1 also illustrates electron sensor 22 located out of the column 15 and a scattered electron beam 44 scattered from the sample due to the illumination of the sample with the electron beam 41. SEM 10 may include one or more in-column electron sensors, in addition to any out of column electron sensors such as electron sensor 22.

The optical auto-focus unit 18 may be configured to determine a length of an optical path of the reflected optical beam. The determination of the focus status is based on the length of the optical path.

The optical auto-focus unit 18 may be configured to determine a length of an optical path of the reflected optical beam, and a tilt angle of the reflected optical beam. The determination of the focus status is based on the length of the optical path and on the tile angle.

A non-zero tilt angle may impact the misfocus calculation—as it introduces a difference between the length (L) of the optical path of the reflected optical beam and a distance (Drp) of a reference point in the column from the sample.

The reference point is defined as follows: when there is a zero-tilt angle, the distance between the reference point and the sample equals the length of the optical path of reflected optical beam.

Accordingly, Drp equals the square room of a sum of (i) a square of L and (ii) a square of the distance, on the surface, between the optical beam and the electron beam.

FIG. 1 illustrates the optical auto-focus unit 18 as having a sensing unit 18(1) that is positioned outside the column. The window 17 optically couples the sensing unit of the optical auto-focus unit 18 to one or more optical elements within the column. The one or more optical elements within the column may include a mirror 21 that is configured to deflect the optical beam 42 towards 'the sample and to deflect the reflected optical beam 43 towards the window.

Figure 2:
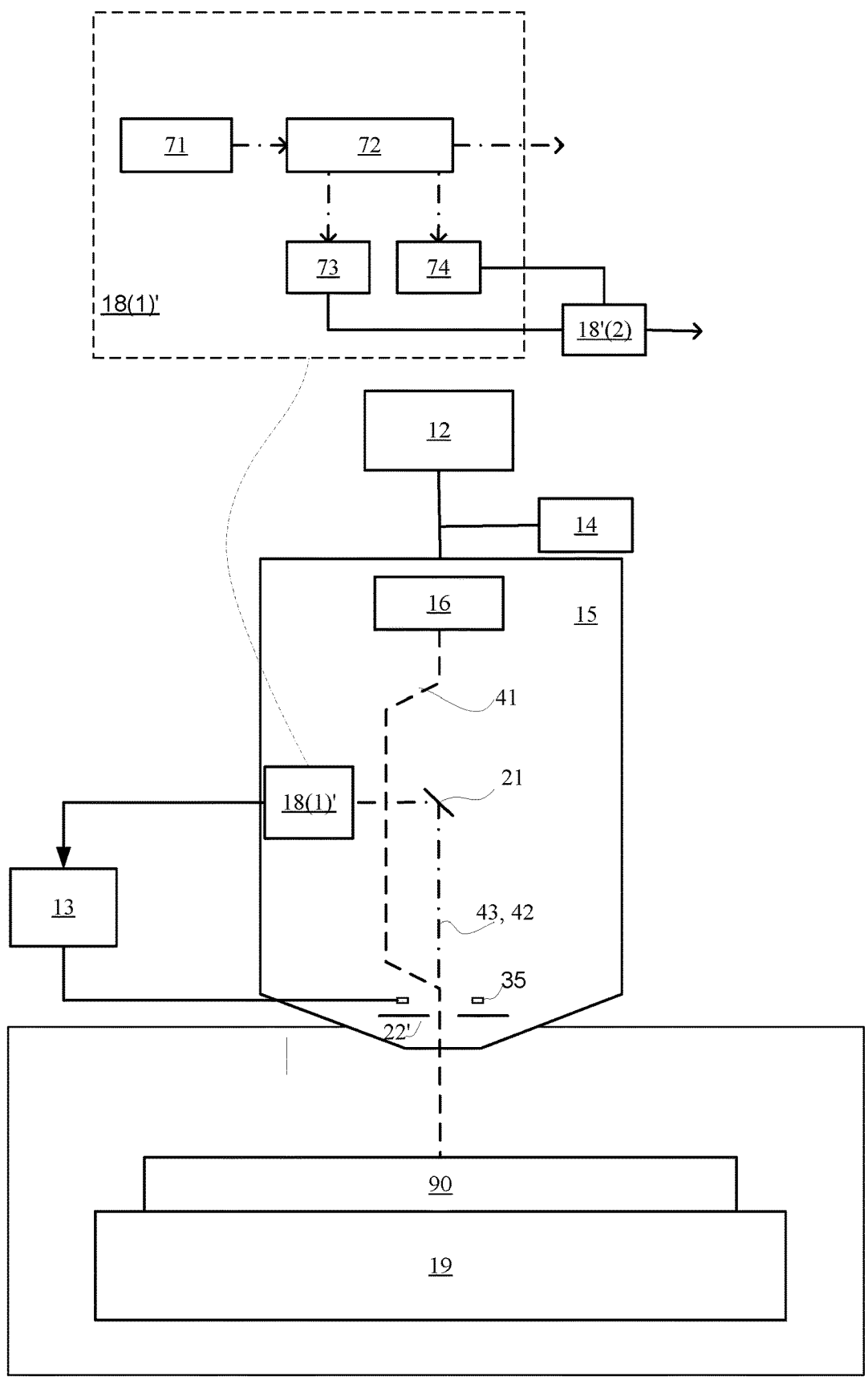
FIG. 2 illustrates an example of a system and a sample.

The optical auto-focus unit 18 may be configured to participate in the compensating of an electron beam misfocus by (a) sending instructions or requests to an electron optic element such as electron optic lens 35 to change the focal point of the electron beam, and/or by (b) sending instructions or requests to mechanical stage 19 to change the distance between the column and the sample 90. The electron optic lens 35 may be located in various locations within the column and FIGS. 1 and 2 illustrate two locations.

One or more instructions and/or one or more requests may be sent via an electron optics controller and/or via a mechanical stage controller. For simplicity of explanation, FIG. 1 illustrates control lines from controller 13 to the electrostatic lens and to the mechanical stage.

FIG. 1 illustrates an optical auto-focus unit 18 that includes a sensing unit 18(1) that is a laser interferometric vibrometer. The laser interferometric vibrometer includes laser 61, a first beam splitter (BS) 44, a second BS 67, a third BS 65, mirror 63, Brag cell 64, and detector 66. The sensing unit may differ from the laser interferometric vibrometer.

A laser beam from laser 61 is split by first BS 44 to provide an optical beam 41 and a reference beam, the optical beam 41 passes through second BS 67 and propagates towards window 17.

The reference beam is reflected by mirror 63 to Brag cell 64 which outputs a reference beam that impinges on third B3 65.

Reflected optical beam 43 is directed, by second BS 67, towards third BS 67.

The reflected optical beam 43 and the reference beam are mixed at third BS 56 to provide an interference pattern on detector 66.

The signals from detector 66 are sent to auto-focus processing circuit 18(2) that may determine the focus status and how to compensate for misfocus.

FIG. 2 illustrates SEM 10'. In FIG. 2 the sensing unit 18'(1) of the auto-focus unit 18' is positioned within column 15. In addition, the column also includes an in-lens electron sensor 22'. The sensing unit may be partially positioned within the column, and partially located outside the column. The sensing unit may be positioned within a shield or housing that may prevent contamination of the sensing unit and/or protect the sensing unit.

FIG. 2 also illustrates a sensing unit 18'(1) that includes a laser source 71, optics 72 for directing one or more optical beams such as optical beam, reflected optical beam and the like, optical path length detection unit 73 (for detecting the length of the optical path) and tilt angle detection unit 74 (for detecting the tilt angle of the reflected optical beam).

Figure 3:
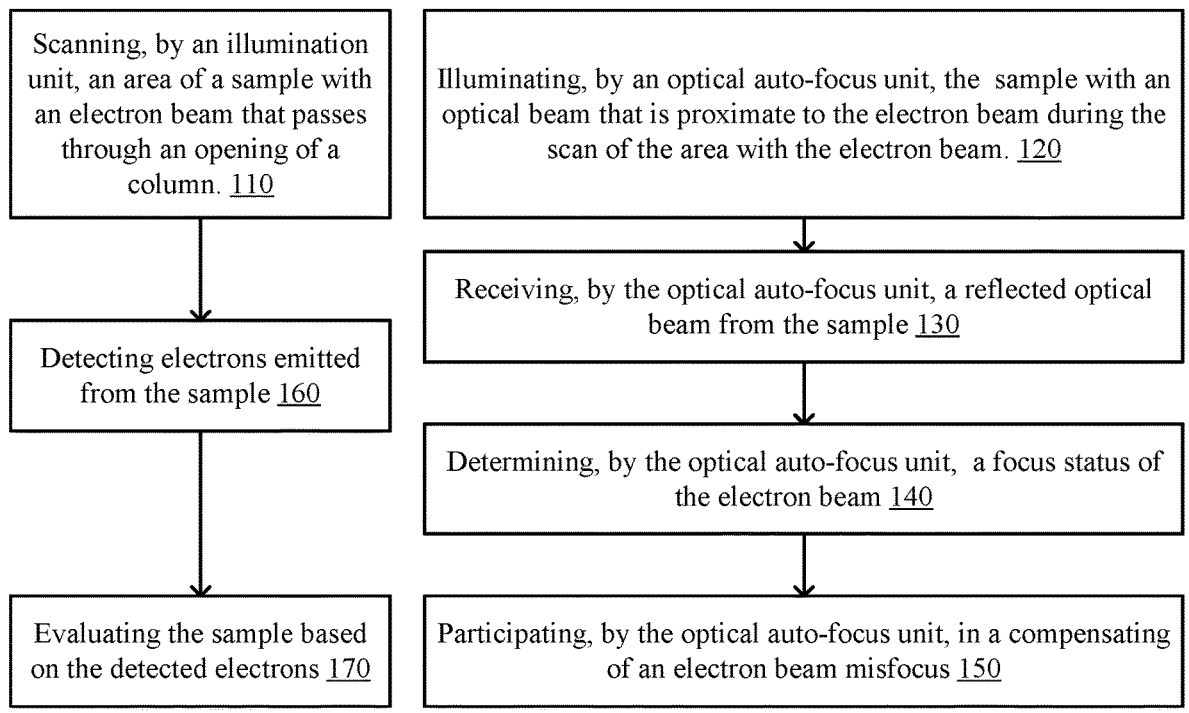
FIG. 3 illustrates an example of a method.

FIG. 3 illustrates a method 100 for auto-focus.

Method 100 may start by steps 110 and 120.

Step 110 may include scanning, by an illumination unit, an area of a sample with an electron beam that passes through an opening of a column.

Step 120 may include illuminating, by an optical auto-focus unit, the sample with an optical beam that is proximate to the electron beam, during the scan of the area with the electron beam. The area may be of millimetric dimensions. The optical beam may scan another area of the sample—the other area may be proximate to the area that is scanned by the electron beam. The other area and the area scanned by the electron beam may overlap or may partially overlap. The optical beam may form a spot on the sample, and the spot may cover the entire area scanned by the electron beam, the spot may cover only some of the area scanned by the electron beam or may be outside the area scanned by the electron beam.

Step 120 may be followed by step 130 of receiving, by the optical auto-focus unit, a reflected optical beam from the sample.

Step 130 may be followed by step 140 of determining, by the optical auto-focus unit, a focus status of the electron beam.

Step 140 may be followed by step 150 of participating, by the optical auto-focus unit, in a compensating of an electron beam misfocus.

Step 140 may include determining a length of an optical path of the reflected optical beam. The determining of the focus status is based on the length of the optical path.

Step 140 may include determining, by the optical auto-focus unit, a length of an optical path of the reflected optical beam and a tilt angle of the reflected optical beam. The determining of the focus status is based on the length of the optical path and on the tile angle.

At least step 120 may be executed by an optical auto-focus unit that includes a sensing unit that is positioned outside the column, wherein the column comprises a window that optically couples the sensing unit to one or more optical elements within the column. The one or more optical elements within the column may include a mirror that is configured to deflect the optical beam towards the sample and to deflect the reflected optical beam towards the window.

Step 150 may include at least one out of executing the entire compensating, executing part of the compensating, triggering the compensating, requesting the compensating, commanding the compensating, communicating with a controller of an electron optics lens, communication with the electron optics lens, communicating with a controller is a mechanical stage, communicating with the mechanical stage, and the like.

The optical auto-focus unit may include a laser interferometric vibrometer.

At least step 120 may be executed by an optical auto-focus unit that includes a sensing unit that is positioned within the column.

Step 110 may be followed by step 160 of detecting electrons emitted from the sample.

Step 160 may be followed by step 170 of evaluating the sample based on the detected electrons. The evaluating may include defect review, defect detection, metrology, critical dimension measurements, and the like.

In the foregoing specification, the embodiments of the disclosure have been described with reference to specific examples of embodiments. It will, however, be evident that various modifications and changes may be made therein without departing from the broader spirit and scope of the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A charged particle evaluation system comprising:
    a column that comprises an opening;
    an illumination unit that is configured to scan an area of a sample with an electron beam that passes through the opening; and
    an optical auto-focus unit that is configured to: (i) illuminate the sample with an optical beam that is proximate to the electron beam, during the scan of the area with the electron beam, (ii) receive a reflected optical beam from the sample, (iii) determine a focus status of the electron beam, and (iv) participate in a compensating of an electron beam misfocus;
    wherein the optical auto-focus unit comprises a mirror, positioned within the column, and a sensing unit, wherein the mirror is configured to both deflect the optical beam towards the sample and to deflect the reflected optical beam towards the sensing unit.

2. The charged particle evaluation system according to claim 1, wherein the optical auto-focus unit is configured to determine a length of an optical path of the reflected optical beam, and wherein a determination of the focus status is based on the length of the optical path.

3. The charged particle evaluation system according to claim 1, wherein the optical auto-focus unit is configured to determine (a) a length of an optical path of the reflected optical beam, and (b) a tilt angle of the reflected optical beam, and wherein a determination of the focus status is based on the length of the optical path and on the tilt angle.

4. A charged particle evaluation system comprising:
    a column that comprises an opening;
    an illumination unit that is configured to scan an area of a sample with an electron beam that passes through the opening; and
    an optical auto-focus unit that is configured to: (i) illuminate the sample with an optical beam that is proximate to the electron beam, during the scan of the area with the electron beam, (ii) receive a reflected optical beam from the sample, (iii) determine a focus status of the electron beam, and (iv) participate in a compensating of an electron beam misfocus;
    wherein the optical auto-focus unit comprises a sensing unit that is positioned outside the column, wherein the column comprises a window that optically couples the sensing unit to one or more optical elements within the column; and wherein the one or more optical elements within the column comprise a mirror that is configured to deflect the optical beam towards the sample and to deflect the reflected optical beam towards the window.

5. The charged particle evaluation system according to claim 1, wherein the optical auto-focus unit is configured to participate in the compensating of an electron beam misfocus by sending instructions to a mechanical stage.

6. The charged particle evaluation system according to claim 1, wherein the optical auto-focus unit comprises a laser interferometric vibrometer.

7. The charged particle evaluation system according to claim 1, wherein the optical auto-focus unit comprises a sensing unit that is positioned within the column.

8. The charged particle evaluation system according to claim 1, wherein the optical auto-focus unit is configured to participate in the compensating of an electron beam misfocus by sending instructions to an electron optic element.

9. A method for auto-focus, the method comprising:
scanning, by an illumination unit, an area of a sample with an electron beam that passes through an opening of a column;
illuminating, by an optical auto-focus unit, the sample with an optical beam that is proximate to the electron beam, during the scan of the area with the electron beam;
receiving, by the optical auto-focus unit, a reflected optical beam from the sample;
determining, by the optical auto-focus unit, a focus status of the electron beam; and
participating, by the optical auto-focus unit, in a compensating of an electron beam misfocus;
wherein the optical auto-focus unit comprises a mirror, positioned within the column, and a sensing unit, wherein the mirror is configured to both deflect the optical beam towards the sample and to deflect the reflected optical beam towards the sensing unit.

10. The method according to claim 9, comprising determining, by the optical auto-focus unit, a length of an optical path of the reflected optical beam, and wherein the determining of the focus status is based on the length of the optical path.

11. The method according to claim 9, comprising determining, by the optical auto-focus unit, a length of an optical path of the reflected optical beam and a tilt angle of the reflected optical beam, and wherein the determining of the focus status is based on the length of the optical path and on the tilt angle.

12. A method for auto-focus, the method comprising:
scanning, by an illumination unit, an area of a sample with an electron beam that passes through an opening of a column;
illuminating, by an optical auto-focus unit, the sample with an optical beam that is proximate to the electron beam, during the scan of the area with the electron beam;
receiving, by the optical auto-focus unit, a reflected optical beam from the sample;
determining, by the optical auto-focus unit, a focus status of the electron beam; and
participating, by the optical auto-focus unit, in a compensating of an electron beam misfocus;
wherein the optical auto-focus unit comprises a sensing unit that is positioned outside the column, wherein the column comprises a window that optically couples the sensing unit to one or more optical elements within the column; and
the one or more optical elements within the column comprise a mirror that is configured to deflect the optical beam towards the sample and to deflect the reflected optical beam towards the window.

13. The method according to claim 9, wherein the participating in the compensating of an electron beam misfocus comprises sending instructions to an electron optics lens.

14. The method according to claim 9, wherein the optical auto-focus unit comprises a laser interferometric vibrometer.

15. The method according to claim 9, wherein the optical auto-focus unit comprises a sensing unit that is positioned within the column.

16. A non-transitory computer readable medium method that stores instructions that once executed by a charged particle evaluation system, cause the charged particle evaluation system to:
scan, by an illumination unit of the charged particle evaluation system, an area of a sample with an electron beam that passes through an opening of a column;
illuminate, by an optical auto-focus unit of the charged particle evaluation system, the sample with an optical beam that is proximate to the electron beam, during the scan of the area with the electron beam;
receive, by the optical auto-focus unit, a reflected optical beam from the sample;
determine, by the optical auto-focus unit, a focus status of the electron beam; and
participate, by the optical auto-focus unit, in a compensating of an electron beam misfocus;
wherein the optical auto-focus unit comprises a mirror, positioned within the column, and a sensing unit, wherein the mirror is configured to both deflect the optical beam towards the sample and to deflect the reflected optical beam towards the sensing unit.

* * * * *